United States Patent
Allemand

(10) Patent No.: US 11,020,802 B2
(45) Date of Patent: *Jun. 1, 2021

(54) METHODS OF CONTROLLING NANOSTRUCTURE FORMATIONS AND SHAPES

(71) Applicant: Cambrios Film Solutions Corporation, Tortola (VG)

(72) Inventor: Pierre-Marc Allemand, San Jose, CA (US)

(73) Assignee: Cambrios Film Solutions Corporation, Tortola (VG)

( * ) Notice: Subject to any disclaimer, the term of this patent is extended or adjusted under 35 U.S.C. 154(b) by 142 days.

This patent is subject to a terminal disclaimer.

(21) Appl. No.: 16/416,569

(22) Filed: May 20, 2019

(65) Prior Publication Data

US 2019/0275590 A1  Sep. 12, 2019

Related U.S. Application Data

(60) Continuation of application No. 16/226,613, filed on Dec. 19, 2018, which is a continuation of application No. 15/234,272, filed on Aug. 11, 2016, now Pat. No. 10,195,670, which is a continuation of application No. 14/247,689, filed on Apr. 8, 2014, now Pat. No. 9,440,291, which is a continuation of application No. 13/040,549, filed on Mar. 4, 2011, now Pat. No. 8,709,125, which is a division of application No. 11/766,552, filed on Jun. 21, 2007, now Pat. No. 8,454,721.

(60) Provisional application No. 60/815,627, filed on Jun. 21, 2006.

(51) Int. Cl.
| | |
|---|---|
| B22F 9/24 | (2006.01) |
| C30B 7/14 | (2006.01) |
| C30B 29/60 | (2006.01) |
| B22F 1/00 | (2006.01) |
| B82Y 30/00 | (2011.01) |
| B82Y 40/00 | (2011.01) |

(52) U.S. Cl.
CPC .............. *B22F 9/24* (2013.01); *B22F 1/0025* (2013.01); *B82Y 30/00* (2013.01); *B82Y 40/00* (2013.01); *C30B 7/14* (2013.01); *C30B 29/60* (2013.01); *B22F 2009/245* (2013.01); *B22F 2301/25* (2013.01); *B22F 2301/255* (2013.01); *B22F 2304/054* (2013.01); *B22F 2998/00* (2013.01); *B22F 2998/10* (2013.01); *B22F 2999/00* (2013.01)

(58) Field of Classification Search
CPC ..................................... B22F 9/24; C30B 7/14
USPC ............................................................ 75/370
See application file for complete search history.

(56) References Cited

U.S. PATENT DOCUMENTS

| | | | | |
|---|---|---|---|---|
| 8,454,721 B2 * | 6/2013 | Allemand | .............. | B82Y 30/00 75/343 |
| 2006/0083694 A1 * | 4/2006 | Kodas | ................. | B01J 13/0043 424/46 |

* cited by examiner

*Primary Examiner* — Weiping Zhu
(74) *Attorney, Agent, or Firm* — Cooper Legal Group, LLC

(57) ABSTRACT

A method of forming monodispersed metal nanowires comprising; forming a reaction mixture including a metal salt, a capping agent and an ionic additive in a polar solvent at a first temperature; and forming metal nanowires by reducing the metal salt in the reaction mixture.

20 Claims, 6 Drawing Sheets

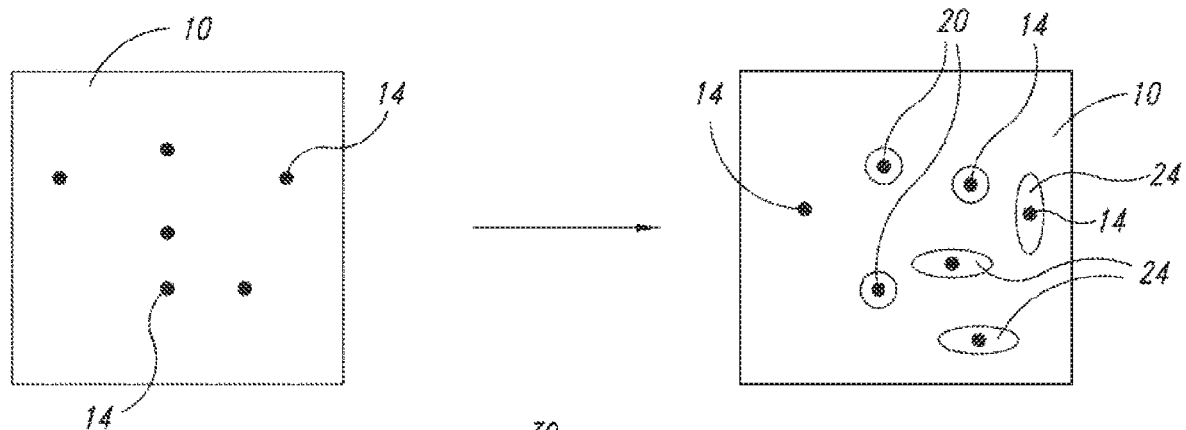
FIG. 1A (Prior Art)
FIG. 1B (Prior Art)
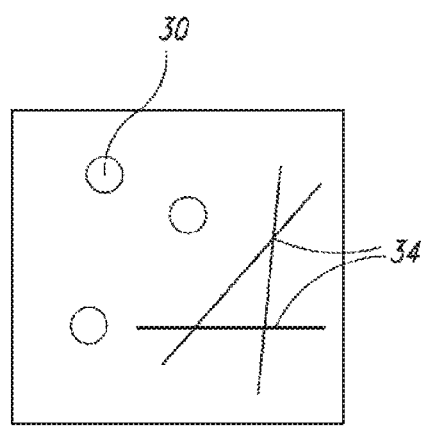
FIG. 1C (Prior Art)
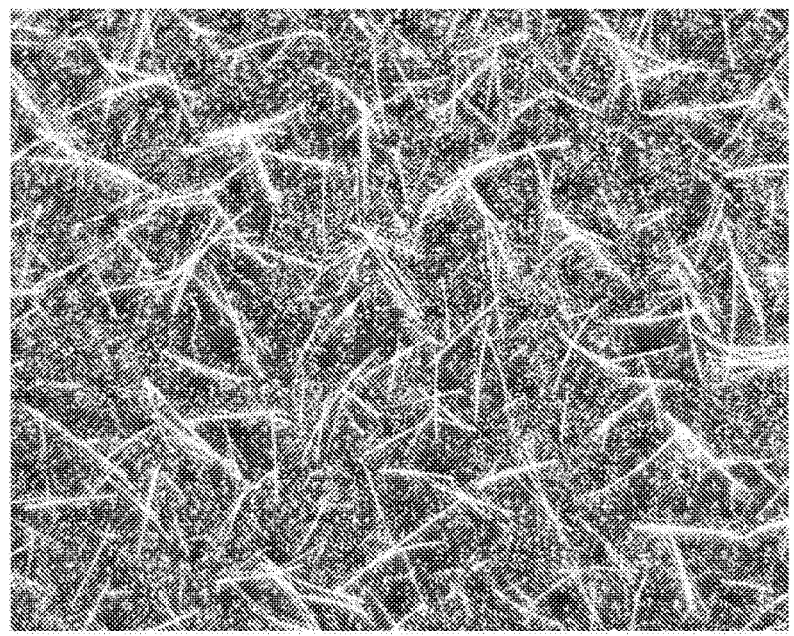
FIG. 2 (Prior Art)

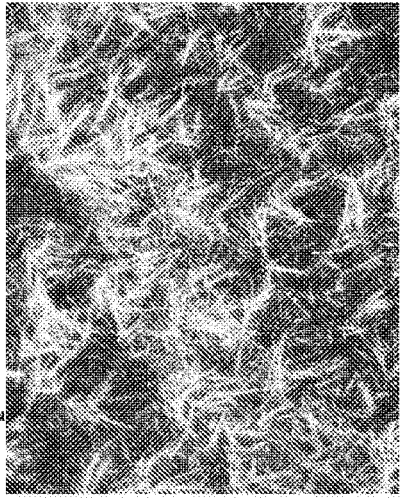
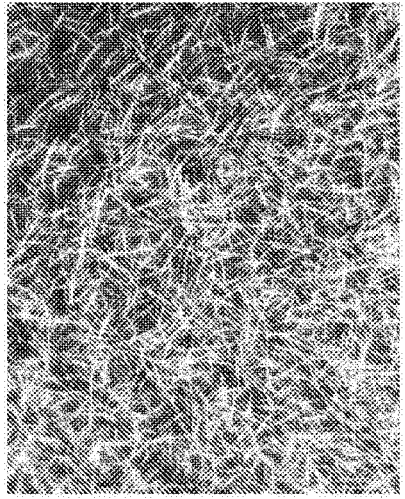
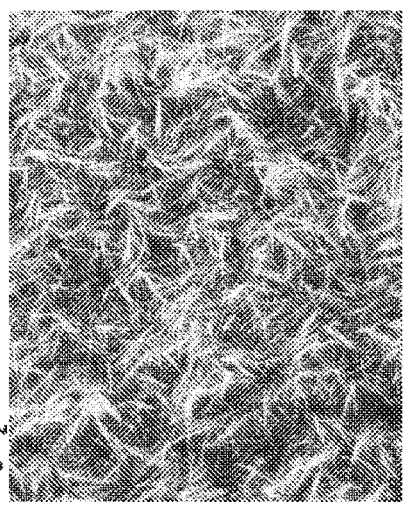
FIG. 4A
FIG. 4B
FIG. 4C
FIG. 4D

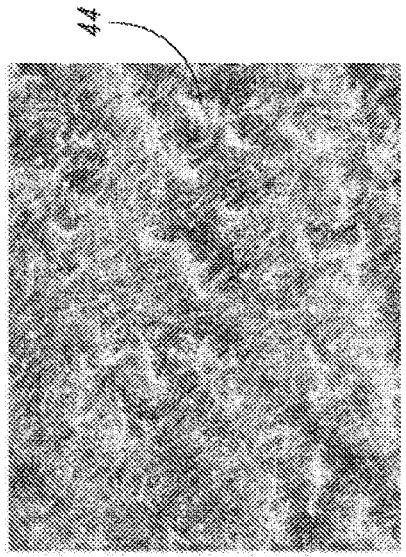
*FIG. 5C* 9 Min
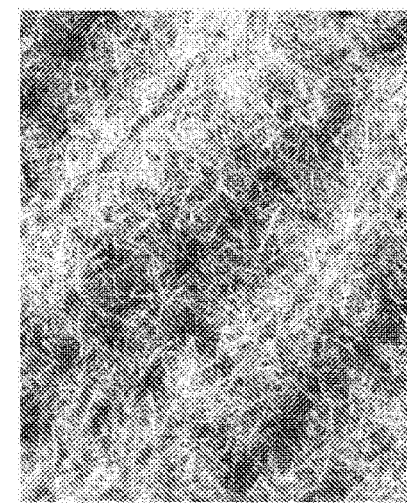
*FIG. 5F* 20 Min
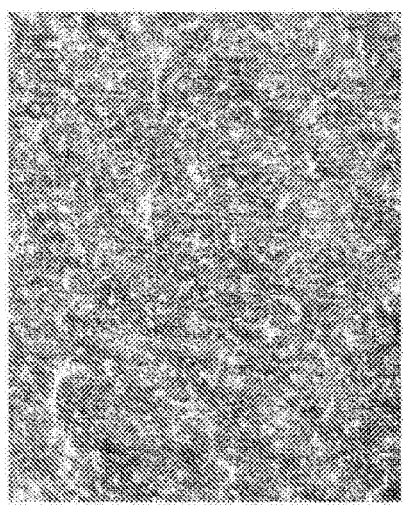
*FIG. 5B* 8 Min
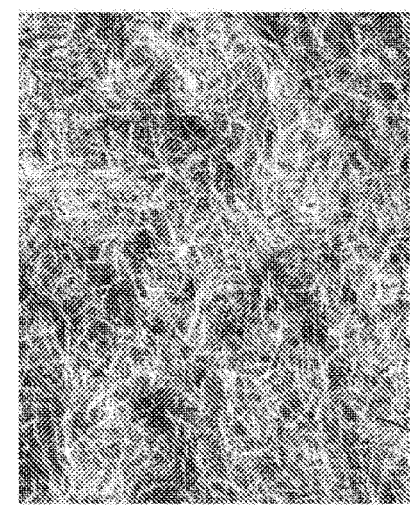
*FIG. 5E* 15 Min
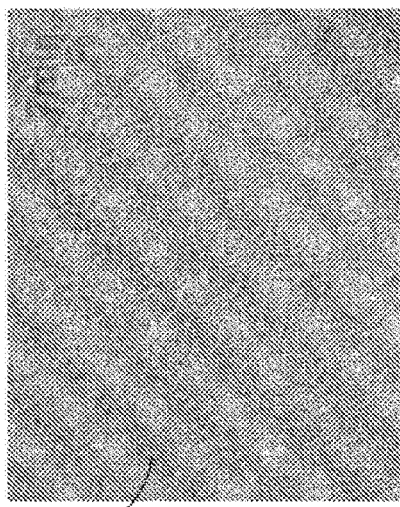
*FIG. 5A* 7 Min
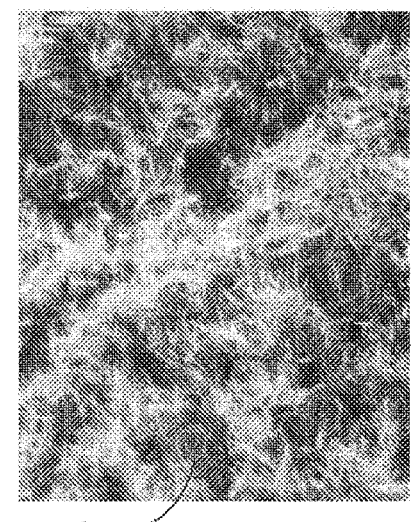
*FIG. 5D* 10 Min

METHODS OF CONTROLLING NANOSTRUCTURE FORMATIONS AND SHAPES

CROSS-REFERENCE TO RELATED APPLICATION

This application is a continuation application of U.S. application Ser. No. 16/226,613, filed Dec. 19, 2018, still pending, which is a continuation application of U.S. application Ser. No. 15/234,272, filed Aug. 11, 2016, now issued as U.S. Pat. No. 10,195,670, which is a continuation application of U.S. application Ser. No. 14/247,689, filed Apr. 8, 2014, now issued as U.S. Pat. No. 9,440,291, which is a continuation application of U.S. application Ser. No. 13/040,549, filed Mar. 4, 2011, now issued as U.S. Pat. No. 8,709,125, which is a divisional application of U.S. application Ser. No. 11/766,552 filed Jun. 21, 2007, now issued as U.S. Pat. No. 8,454,721, which claims the benefit under 35 U.S.C. § 119(e) of U.S. Provisional Patent Application No. 60/815,627 filed Jun. 21, 2006. Application Ser. Nos. 16/226,613, 15/234,272, 14/247,689, 13/040,549, 11/766,552 and 60/815,627 are incorporated herein by reference in their entireties.

BACKGROUND OF THE INVENTION

Filed of the Invention

This application is related to methods of controlling the amount, shape and dimension of nanostructures by solution-based synthesis, more specifically, to the controlled formation of metal nanowires.

Related Art of the Invention

Nano-sized materials (or nanomaterials) can differ markedly from their analogous bulk materials. In particular, the physical and chemical properties of nanomaterials correlate strongly with their size, shape and morphology. As a result, materials scientists have focused their efforts on developing simple and effective methods for fabricating nanomaterials with controllable shapes, sizes and morphology, hence tailoring their properties.

A solution-based synthesis (also referred to as the "polyol" process) is reasonably effective in large-scale production of metal nanostructures. See, e.g., Sun, Y. et al., (2002) Science, 298, 2176; Sun, Y. et al., (2002) Nano Lett. 2, 165; Sun, Y. et al., (2002) Adv. Mater. 14, 833; Kim, F. et al., (2004) Angew. Chem. Int. Ed. 116, 3759; and U.S. Published Application 2005/0056118. The polyol process involves the reduction of a precursor (e.g., a metal salt) of the metal nanostructure by a polyol (e.g., ethylene glycol) in the presence of poly(vinyl pyrrolidone) ("PVP"). Typically, the reduction is carried out at a temperature of no more than 200° C. Ethylene glycol serves the dual functions as the solvent and the reducing agent. Typically, the shapes and sizes of the nanostructures formed are affected by parameters including, relative amounts of PVP and the metal salt, concentrations of PVP and the metal salt, reaction time, and reaction temperature.

According to this method, metal nanostructures of various morphologies, including nanocubes, nanowires, nanopyramides and multiply twinned particles, have been obtained. However, a common problem of the polyol process is that a mixture of nanostructures of several shapes is produced. The problem is compounded by poor reproducibility of the process, which is likely caused by trace amount of contaminants in the constituents of the synthesis. See, e.g., Wiley, B. et al., (2004) Nano Lett. 4(9), 1733-1739.

The polyol process has been modified in efforts to form nanostructures of uniform shapes and sizes. For example, adding trace amount of chloride to the "polyol" process created single crystal truncated cubes and tetrahedrons. See, e.g., Wiley, B. et al., (2004) Nano Lett. 4(9), 1733-1739. Using a seed material (e.g., platinum or silver nanoparticles) in the "polyol" process generated uniform silver nanowires of high aspect ratio (about 1000). Sun, Y. et al. (2002) Chem. Mater. 14, 4736-4745. However, the problem of producing mixed nanostructures (e.g., the silver nanowires were accompanied by the formation of silver nanoparticles) persists in the existing methods. Additional separation steps are therefore necessary to obtain monodispersed nanostructures.

There remains a need in the art to fabricate nanostructures with controllable shapes and sizes in an effective and reproducible fashion.

SUMMARY OF THE INVENTION

One embodiment describes a modified polyol method for selective formation of metal nanowires, the method comprises: forming a reaction mixture including a metal salt, a capping agent and a quaternary ammonium chloride in a reducing solvent; and forming metal nanowires by reducing the metal salt in the reaction mixture.

In various embodiments, the capping agent is poly(vinyl pyrrolidone), polyacrylamide, polyacrylic or a copolymer thereof.

In various embodiments, the reducing solvent comprises at least two hydroxyl groups. More specifically, the reducing solvent can be ethylene glycol, 1,2-propylene glycol, 1,3-propylene glycol, glycerin, glycerol, or glucose.

Another embodiment describes a composition comprising: a metal salt; a capping agent selected from poly(vinyl pyrrolidone), polyacrylamide, polyacrylic and copolymers thereof; a quaternary ammonium chloride; and a reducing solvent including at least two hydroxyl groups.

BRIEF DESCRIPTION OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not intended to convey any information regarding the actual shape of the particular elements, and have been selected solely for ease of recognition in the drawings.

FIGS. 1A-1C illustrate schematically the nucleation and growth of nanostructures of different morphologies in a polyol process.

FIG. 2 shows the reaction products of mixed nanowires and nanoparticles according to a standard polyol process.

FIGS. 4A-4D illustrate various embodiments in which various chloride additives are used in modified polyol processes.

FIGS. 5A-5F show a progression of the nanowire formation at different reaction times.

DETAILED DESCRIPTION OF THE INVENTION

Figure 3:
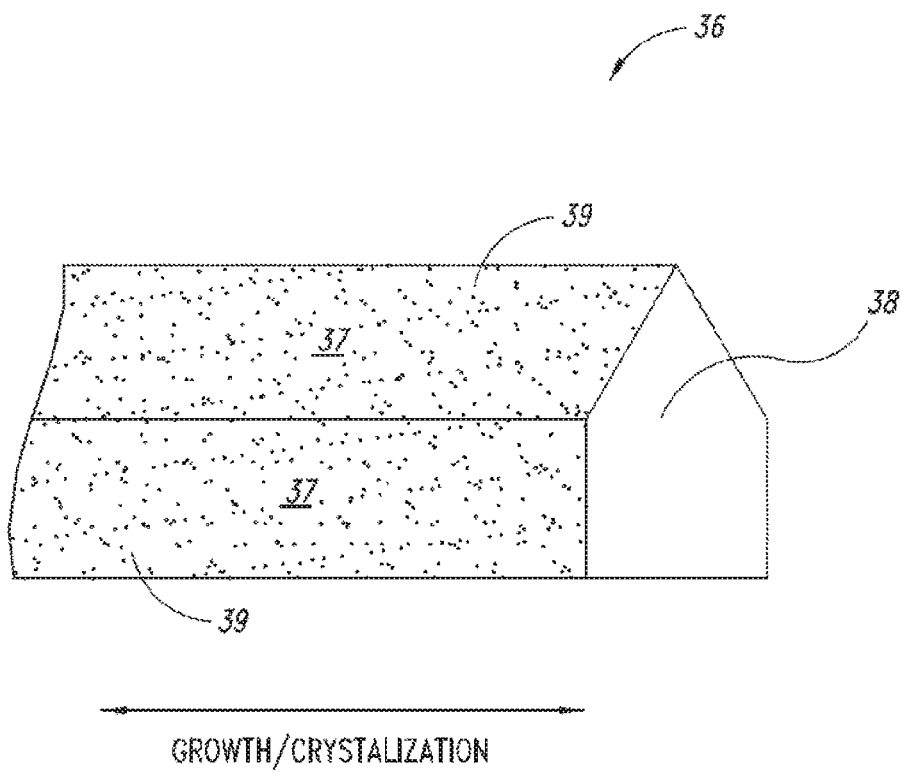
FIG. 3 schematically illustrates a one-dimensional growth of a nanowire with the assistance of a capping agent.

Nanowires, especially metal nanowires, can be used as conductive media in many applications. In particular, networks of metal nanowires (e.g., silver nanowires) impart both electrical conductivity and high optical transmission, which makes them a suitable material for fabricating transparent conductors.

Nanowires formed by the standard polyol process are typically accompanied by varying amounts of nanoparticles. See, e.g. Sun, Y. et al. (2002) *Chem. Mater.* 14, 4736-4745. As used herein, both "nanoparticles" and "nanowires" refer to nanostructures in which at least one dimension is less than 500 nm. For example, at least one dimension of the nanostructure may be less than 100 nm, less than 50 nm, or less than 10 nm.

A nanowire is a one-dimensional nanostructure of high aspect ratio (length/width), i.e., the nanowire has an aspect ratio of greater than 10. Typically, the nanowire has an aspect ratio of greater than 50, more typically greater than 100, and more typically greater than 1000. In contrast, a nanoparticle has an aspect ratio of no more than 10. For example, the nanoparticle typically has an aspect ratio of no more than 5, and more typically no more than 2, more typically no more than 1.

FIGS. 1A-1C schematically illustrate the formation of these nanostructures in a standard polyol process. At an initial stage (FIG. 1A), the metal salt is reduced to elemental metal atoms by ethylene glycol in a solution phase 10. In general, the metal atoms initially form small particulate seeds 14 through a homogeneous nucleation process. These particulate seeds typically have diameters in the range of 1-5 nm. Some of these seeds proceed to grow in the solution phase 10 into isotropic nanostructures 20, which result from a growth that progresses indiscriminately in all dimensions. In contrast, some seeds grow into anisotropic nanostructures 24, which result from a preferential growth along a lateral dimension. As shown in FIG. 1C, the isotropic nanostructures 20 and anisotropic nanostructures 24 continue to grow into larger structures while maintaining their basic morphologies. Nanoparticles 30 and nanowires 34 are obtained. It is noted that during the growth process, smaller particles are less stable and typically spontaneously dissolve and contribute to the growth of the larger particles. See, e.g., U.S. Published Patent Application No. 2005/0056118, Although reaction conditions such as the reaction time and temperature can be adjusted to bias the formation of the nanowires, the standard polyol process fails to produce uniform nanowires in satisfactory yields. FIG. 2 is an image of the reaction products of a standard polyol process using silver nitrate as the precursor. As shown, both nanowires and nanoparticles are present.

One embodiment thus describes a method of forming monodispersed nanostructures (e.g., nanowires) based on a modified polyol process, which is mediated by at least an ionic additive. It is believed that the ionic additive promotes the formation of a single morphology while discouraging other competing nanostructures. In particular, the method produces predominately nanowires with no or few nanoparticles. As used herein, "monodispersity" refers to at least 85%, more preferably, at least 90%, 95% or 98% by weight of nanowires.

More specifically, the method comprises: forming a reaction mixture including a metal salt, at least an ionic additive and a capping agent in a reducing solvent; and forming metal nanowires by reducing the metal salt in the reaction mixture.

"Metal salt" refers to a neutral compound having a positively charged metal ion and a negatively charged counterion. The counterion may be inorganic or organic. Exemplary metal salts include, without limitation: silver nitrate ($AgNO_3$), silver acetate ($CH_3COO)_2Ag$), silver perchlorate ($AgClO_4$), gold perchlorate ($Au(ClO_4)_3$), palladium chloride ($PdCl_2$), platinum chloride ($PtCl_2$) and the like. Typically, the metal salt is soluble in the reducing solvent (e.g. ethylene glycol) and dissociates into oppositely charged metal ion and the counterion. Typically, the solubility of the metal salt in the reducing solvent is at least 0.001 g/ml, at least 0.05 g/ml, or at least 0.1 g/ml.

Reduction of the metal salt in the above reaction mixture produces corresponding elemental metal. The elemental metal crystallizes or grows into a one-dimensional nanostructure (i.e. nanowires). Suitable metal nanowires therefore include without limitation, silver, gold, copper, nickel, palladium, platinum and gold-plated silver nanowires.

"Capping agent" refers to a chemical agent that preferentially interacts and adheres to a lateral surface of a growth nanowire, such that the capping agent confines the lateral surface from growing and encourages a cross section surface of the nanowire to crystallize. FIG. 3 schematically illustrates a one-dimensional growth of the growing nanowire 36. The growing nanowire 36 includes the lateral surface 37 and the cross section surface 38. The capping agent 39 interacts with the lateral surface 36 more strongly than it does with the cross section surface 38. The lateral surface 36 is thus passivated while the cross section surface 38 is available for further crystallization to produce the nanowire. Examples of the capping agent include without limitation, poly(vinyl pyrrolidone), polyarylamide, polyacrylic and any of the copolymers thereof.

"Reducing solvent" refers to a polar solvent in which the metal salt, the ionic additive and the capping agent are soluble. In addition, the reducing solvent functions as a reducing agent to transform the metal salt to its corresponding elemental metal. Typically, the reducing solvent is a chemical reagent comprising at least two hydroxyl groups. Examples of the reducing solvents include without limitation, diols, polyols, glycols, or mixtures thereof. More specifically, the reducing solvent can be, for example, ethylene glycol, 1,2-propylene glycol, 1,3-propylene glycol, glycerin, glycerol, and glucose.

"Ionic additive" refers to a salt additive comprising a cation and an anion. The cation and anion are associated by ionic interaction and dissociate in polar solvents such as water, alcohol, diols and polyols (including ethylene glycol, 1,2-propylene glycol, 1,3-propylene glycol, glycerin, glycerol, and glucose). The cation can be organic or inorganic. The anions are typically inorganic. Exemplary anions include halides ($Cl^-$, $Br^-$, $I^-$, $F^-$), phosphate ($PO_4^{3-}$), sulfate ($SO_4^{2-}$), hydrogen sulfate ($HSO_4^-$), aryl and alkyl sulfonates ($RSO_3^-$), and the like. The ionic additive may further include their corresponding acids, i.e., the cation is a proton.

In certain embodiments, the ionic additive is a quaternary ammonium chloride. As used herein, "quaternary ammonium chloride" refers to ammonium chloride ($NH_4^+Cl^-$) in which, all four hydrogens have been replaced by an organic group. Thus, the quaternary ammonium chloride can be typically represented by formula $NR_4^+Cl^-$, wherein each R is the same or different and independently an alkyl, alkenyl, alkynyl, aryl, or aralkyl.

"Alkyl" refers to monovalent saturated hydrocarbon structure of between 1 and 20 carbons, in which the carbons are arranged in either a linear or branched manner. Lower alkyl refers to alkyl groups of 1 to 5 carbon atoms. Examples of lower alkyl groups include methyl, ethyl, propyl, isopropyl, butyl, s- and t-butyl and the like. Examples of alkyl groups of longer chains include octyl ($C_8$), decyl ($C_{10}$), dodecyl ($C_{12}$), cetyl ($C_{16}$), and the like. When an alkyl residue having a specific number of carbons is named, all geometric isomers having that number of carbons are contemplated; thus, for example, "butyl" is meant to include n-butyl, sec-butyl, isobutyl and t-butyl; propyl includes n-propyl and isopropyl.

Unless specified otherwise, the alkyl can be optionally substituted with a halogen (F, Br, Cl or I), alkoxy, amine and the like.

"Alkenyl" refers to a monovalent hydrocarbon structure of between 2 and 20 carbon atoms with at least one double bond. Examples include without limitation: ethenyl, propenyl, butenyl, pentenyl, hexenyl, butadienyl, pentadienyl and the like. Unless specified otherwise, the alkyl can be optionally substituted with a halogen (F, Br, Cl or I), alkoxy, amine or the like.

"Alkynyl" refers to a monovalent hydrocarbon structure of between 2 and 20 carbon atoms with at least one triple bond. Examples include without limitation: ethynyl, propynyl, butynyl, pentynyl, hexynyl, methylpropynyl, 4-methyl-1-butynyl, 4-propyl-2-pentynyl and the like.

"Alkoxy" refers to a radical of the formula —O-alkyl. Examples include methoxy, ethoxy, propoxy, isopropoxy, and the like. Lower-alkoxy refers to groups containing one to five carbons.

"Aryl" refers to optionally substituted phenyl or naphthyl. Exemplary substituents for aryl include one or more of halogen, hydroxy, alkoxy, amino, mercapto or the like.

"Aralkyl" refers to an alkyl residue substituted with at least an aryl group. The aralkyl can be typically represented by the formula aryl-alkyl-. Exemplary aralkyls include without limitation phenylmethyl (i.e., benzyl) or phenylethyl group.

Exemplary ionic additives therefore include without limitation: tetramethylammonium chloride (TMAC), tetrabutylammonium chloride (TBAC), cetyl trimethylammonium chloride (CTAC), $C_8$-$C_{18}$ alkyl dimethyl benzyl ammonium chloride, methyl trioctylammonium chloride (i.e., Aliquat 336®) and the like.

Quaternary ammonium ions ($NR_4^+$) are permanently charged cations that typically are not influenced by the pH of their environment. They are soluble in the reducing solvent, as defined herein. Moreover, they are compatible with the capping agent (e.g., PVP and its copolymers) due to the organic moieties present.

The quaternary ammonium ions differ from inorganic cations in their effects on the formation of silver nanowires in the modified polyol process. More specifically, the presence of a quaternary ammonium based ionic additive encourages a predominately anisotropic growth of nanostructures to produce nanowires in relatively high yield and relatively high monodispersity.

FIGS. 4A-4D show images of silver nanowire formations using various chloride-based ionic additives, including HCl, $ZnCl_2$, $MgCl_2$ and TBAC, respectively. All the reactions were carried out by initially mixing 0.1M $AgNO_3$, 0.15M PVP and 0.001M of the chlorides at room temperature (25° C.) to 40° C. The reaction mixture was then heated to about 160° C. Typically, nanostructures (nanowires and/or nanoparticles) were formed rapidly after a brief induction period (10-30 minutes). The products were collected after about 30 minutes.

FIGS. 4A-4C show that silver nanowires were formed accompanied by varying degrees of other nanostructures (e.g., nanoparticles). FIG. 4D, by comparison, shows uniform silver nanowires of between 3 and 100 μm long with little or no nanoparticle formation. The yield of the silver nanowires is therefore particularly optimized using TBAC as the additive, with high overall yield and high monodispersity.

The anion (i.e., chloride) in the ionic additive also plays an important role in controlling the nanowire formation. It is found that ionic additives based on other halides (e.g., bromide), do not have the same effect as the chloride-based ionic additive. For example, using cetyl trimethylammonium bromide in the place of cetyl trimethylammonium chloride produces only nanoparticles.

It has been further observed that the concentrations of the constituents in the reaction mixture have certain impact on the formation of the nanostructures and their yields. For example, the metal salt in the reaction mixture is typically in the range of about 0.01M to 0.2M, more preferably 0.05M to 0.1M, for an optimal yield of nanowires. In addition, the concentration of PVP is typically in the range of 0.01M to 0.2M, more preferably, 0.05M to 0.15M.

In various embodiments, the concentration of the quaternary ammonium chloride in the reaction mixture is in the range of 0.001M-0.5 M. Preferably, the concentration is less than 0.1M to avoid precipitation. Typically, the relative molar ratio between the quaternary ammonium chloride and the metal salt is about 0.1% to 10%, more preferably, about 0.5% to 1%.

The reaction temperature influences the yields and length of the metal nanowires formed. Typically, the metal salt, PVP and the ionic additive are mixed in ethylene glycol at a first temperature to provide a reaction mixture. The first temperature can be in the range of about 20° C. to 40° C. The reaction mixture is thoroughly mixed before it is heated to a second temperature. The second temperature is typically maintained in a range of about 50° C. to about 200° C., more typically, at about 150-160° C. At temperatures higher than 170° C., shorter nanowires were formed as compared to the nanowires formed at lower temperatures.

The yield and length of the metal nanowires produced by the modified polyol process are further controlled by the reaction time. FIGS. 5A-5F illustrate a progression of the nanowire formation visualized at ×100 DF. Samples were taken from the reaction mixture at the reaction times indicated. Each sample was cooled in an ice bath to halt the growth of the nanostructures. FIG. 5A shows that within an initial induction period (about 7 minutes), minute particles 40 (e.g., seeds) were formed. As shown in FIGS. 5B-5D, in the next 3 minutes, nanowires 44 rapidly took shape. At 15 minutes into the reaction, longer nanowires 48 populated the reaction mixture (FIG. 5E). Thereafter, an additional 5 minutes yielded more nanowires (FIG. 5F). The reaction was completed within 30 minutes, whereby no more nanowires were formed even with prolonged reaction time.

The reaction times are greatly influenced by the choice of solvent, e.g. 1,2-propylene glycol leads to faster nanowire growth than ethylene glycol while glycerol shows slower reaction rates.

The modified polyol process is described in more detail by the following non-limiting examples.

EXAMPLES

Example 1

Modified Polyol Process—Microscale

In a 10 ml vial, 0.5 ml solution of $AgNO_3$ in ethylene glycol (0.1M) was combined with 0.5 ml solution of PVP in ethylene glycol (0.15M) and 0.5 ml solution of tetrabutylammonium chloride in ethylene glycol (0.001M) at room temperature (25° C.). The vial was dipped into an oil bath (190° C.) for 20-30 minutes for the reaction to complete. Grey and iridescent reaction products were obtained. Visualization under a microscope (×100 DF) indicated uniform nanowires were formed.

The reaction products were allowed to settle to the bottom of the vial and the ethylene glycol was removed. The reaction products were dried, and the reaction products were then re-suspended in 5 ml deionized water. The suspension was filtered through a glass frit (Fine, 4-6 μm, Kontes). The retentate (containing nanowires which could not filter through the frit) were dried and weighed.

Further analysis of the reaction products indicated that they were substantially nanowires, with no or very few nanoparticles.

The silver nanowires produced had a mean diameter of 75±8 nm, and an average length of 9.7±2.6 μm.

The microscale reaction described herein was highly reproducible which consistently yielded at a high percentage of silver nanowires.

Example 2

Without Ionic Additive

Figure 6:
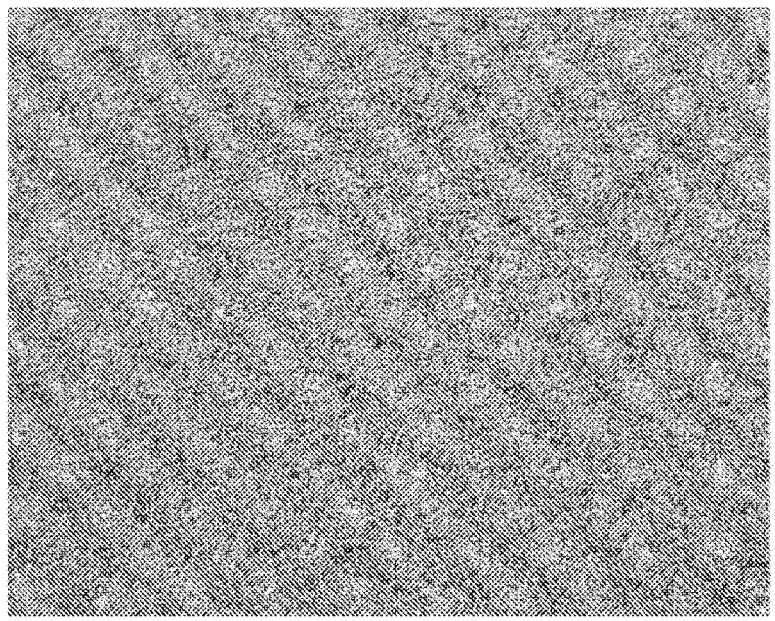
FIG. 6 shows the reaction products of an embodiment in which no ionic additive is present.

As a comparison, the reaction of Example 1 was carried out without the tetrabutylammonium chloride additive. As shown in FIG. 6, only nanoparticles were obtained.

Example 3

Modified Polyol Process—Large-Scale

In a 1000 ml flask, 4.171 g PVP (MW=50,000, 37.6 mmol), 70 mg tetrabutylammonium chloride (0.25 mmol), and 4.254 g $AgNO_3$ (25 mmol) were mixed in 500 ml ethylene glycol). The reaction mixture was stirred at room temperature (25° C.) for 15 minutes before the flask was heated with a heating mantle set to 200° C. The internal temperature of the reaction mixture was controlled at about 150° C. Within 30 minutes, the reaction mixture has turned into a grey and iridescent suspension of silver nanowires. The silver nanowires produced had a mean diameter of 62±7 nm, and an average length of 8.5±1.9 μm. There was no precipitate or nanoparticles formed (See, e.g., FIG. 4D).

The large-scale reaction described herein was highly reproducible.

Example 4

Comparative Result—Standard Polyol Process

For comparison purpose, silver nanowires were also prepared according to the method described in U.S. Published Patent Application No. 2005/0056118. More specifically, 5 ml ethylene glycol was preheated at 160° C. 3 ml of AgNO3 solution in ethylene glycol (0.085M) and 3 ml of PVP solution in ethylene glycol (0.13M) were simultaneously added to the preheated ethylene glycol. The reaction mixture was heated and maintained at 160° C. for 40 minutes. The resulting products were observed as a mixture of nanowires and nanoparticles, shown in FIG. 2.

Example 5

Modified Polyol Process—Large-Scale

In a 5000 ml flask, 49.98 g PVP (MW=50,000, 450 mmol), 0.84 g tetrabutylammonium chloride (3 mmol), and 51.02 g $AgNO_3$ (300 mmol) were mixed in 3000 ml ethylene glycol). The PVP was thoroughly dispersed in about ⅓ of the ethylene glycol with a high shear mixer before being added into the reaction flask. The reaction mixture was stirred at room temperature (25° C.) for 15 minutes before the flask was heated with a heating mantle set to 200° C. The internal temperature of the reaction mixture was controlled at about 140° C. Within 30 minutes, the reaction mixture has turned into a grey and iridescent suspension of silver nanowires. The silver nanowires produced had a mean diameter of 82.6±22.3 nm, and an average length of 14.1±8.1 μm. There were few nanoparticles formed.

The large-scale reaction described herein was highly reproducible.

Example 6

Modified Polyol Process—Lower Temperature

In a 100 ml flask, 0.42 g PVP (MW=50,000, 3.76 mmol), 0.07 ml tetrabutylammonium chloride (0.25 mmol), and 0.43 g $AgNO_3$ (2.5 mmol) were mixed in 50 ml ethylene glycol). The reaction mixture was stirred at room temperature (25° C.) for 15 minutes before the flask was heated in an oven set to 80° C. without stirring. Within 2 weeks, the reaction mixture turned into a grey and iridescent suspension of silver nanowires. The silver nanowires produced had a mean diameter of 62±18 nm, and an average length of 43±20 ∞m. The reaction products were predominantly long, thin nanowires.

Example 7

Modified Polyol Process-1,3-Propylene Glycol Solvent

In a 1000 ml flask, 4.17 g PVP (MW=50,000, 37.6 mmol), 72 mg tetrabutylammonium chloride (0.25 mmol), and 4.25 g $AgNO_3$ (25 mmol) were mixed in 500 ml 1,2-propylene glycol). The reaction mixture was stirred at room temperature (25° C.) for 15 minutes before the flask was heated with a heating mantle set to 200° C. The internal temperature of the reaction mixture was controlled at about 160° C. Within 30 minutes, the reaction mixture turned into a grey and iridescent suspension of silver nanowires. The reaction products were predominantly nanowires.

Example 8

Modified Polyol Process-1,2-Propylene Glycol Solvent

Figure 7:
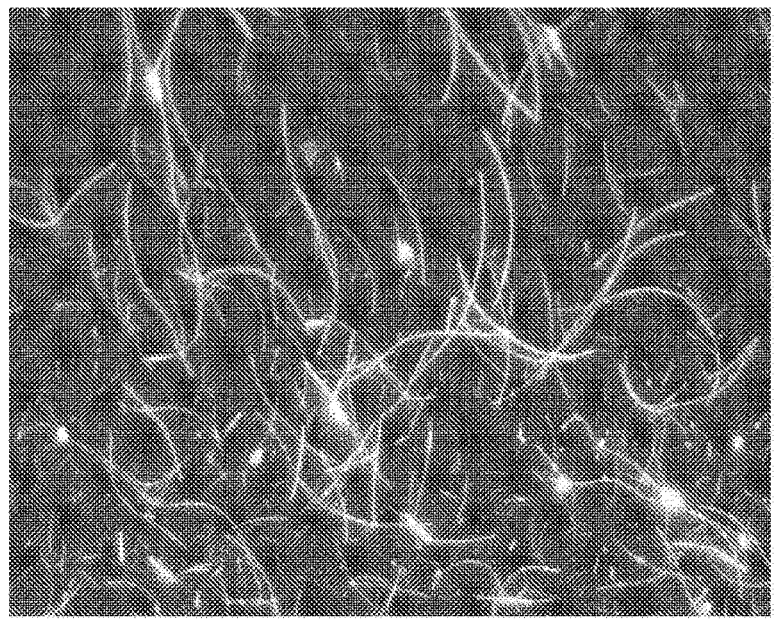
FIG. 7 shows an embodiment in which 1,2-propylene glycol was used as the reducing solvent.

In a 1000 ml flask, 0.417 g PVP (MW=50,000, 3.76 mmol), 7.2 mg tetrabutylammonium chloride (0.025 mmol), and 0.425 g AgNO$_3$ (2.5 mmol) were mixed in 50 ml 1,2-propylene glycol). The reaction mixture was stirred at room temperature (25° C.) for 15 minutes before the flask was heated with a heating mantle set to 81° C. Within 2 days, the reaction mixture turned into a grey and iridescent suspension of silver nanowires. The reaction products were predominantly nanowires as shown in FIG. 7.

Example 9

Modified Polyol Process-1,3-Propylene Glycol Solvent

Figure 8:
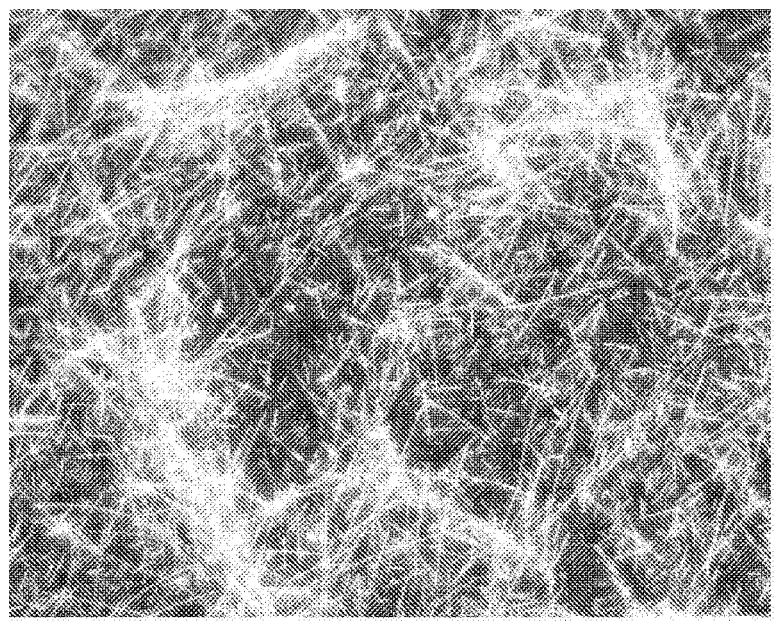
FIG. 8 shows an embodiment in which 1,3-propylene glycol was used as the reducing solvent.

In a 100 ml flask, 0.42 g PVP (MW=50,000, 3.76 mmol), 0.07 ml tetrabutylammonium chloride (0.25 mmol), and 0.43 g AgNO$_3$ (2.5 mmol) were mixed in 50 ml 1,3-propylene glycol). The reaction mixture was stirred at room temperature (25° C.) for 15 minutes before the flask was heated in an oven set to 100° C. without stirring. Within 12 hours, the reaction mixture turned into a grey and iridescent suspension of silver nanowires. The reaction products were predominantly nanowires as shown in FIG. 8.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method of forming metal nanowires comprising:
   forming a reaction mixture including a metal salt, a capping agent selected from poly(vinyl pyrrolidone), polyacrylamide, polyacrylic and copolymers thereof, and an ionic additive in a reducing solvent, wherein a molar ratio of the ionic additive and the metal salt is between 0.001 and 0.1; and
   forming a plurality of metal nanowires by reducing the metal salt.

2. The method of claim 1, wherein at least one dimension of the metal nanowires is less than 100 nm.

3. The method of claim 1, wherein the metal salt is neutral salt.

4. The method of claim 1, wherein a concentration of the ionic additive in the reaction mixture is in the range of 0.001 M-0.5 M.

5. The method of claim 1, wherein the metal salt is silver nitrate, silver acetate, silver perchlorate, gold perchlorate, palladium chloride, or platinum chloride.

6. The method of claim 1, wherein the ionic additive comprises an anion selected from the group consisting of chloride, bromide, iodide, fluoride, phosphate, sulfate, hydrogen sulfate, sulfonate and a combination thereof.

7. The method of claim 6, wherein the ionic additive is HCl, ZnCl$_2$, or MgCl$_2$.

8. The method of claim 1, wherein the molar ratio of the ionic additive and the metal salt is substantially 0.1.

9. The method of claim 1, wherein the reducing solvent is ethylene glycol, 1,2-propylene glycol, 1,3-propylene glycol, glycerin, glycerol, or glucose.

10. The method of claim 1, wherein the capping agent is poly(vinyl pyrrolidone) having a molecular weight of at least 50,000.

11. The method of claim 1, wherein the metal salt is silver nitrate, the capping agent is poly(vinyl pyrrolidone), the ionic additive is a chloride additive and the reducing solvent is ethylene glycol.

12. A method of forming metal nanowires comprising:
    forming a reaction mixture including a metal salt, a capping agent selected from poly(vinyl pyrrolidone), polyacrylamide, polyacrylic and copolymers thereof, and a chloride additive in a reducing solvent, wherein a molar ratio of the chloride additive and the metal salt is between 0.001 and 0.1; and
    forming a plurality of metal nanowires by reducing the metal salt.

13. The method of claim 12, wherein at least one dimension of the metal nanowires is less than 100 nm.

14. The method of claim 12, wherein the metal salt is neutral salt.

15. The method of claim 12, wherein a concentration of the chloride additive in the reaction mixture is in the range of 0.001 M-0.5 M.

16. The method of claim 12, wherein the metal salt is silver nitrate, silver acetate, silver perchlorate, gold perchlorate, palladium chloride, or platinum chloride.

17. The method of claim 12, wherein the chloride additive is HCl, ZnCl$_2$, or MgCl$_2$.

18. The method of claim 12, wherein the reducing solvent is ethylene glycol, 1,2-propylene glycol, 1,3-propylene glycol, glycerin, glycerol, or glucose.

19. The method of claim 12, wherein the molar ratio of the chloride additive and the metal salt is substantially 0.1.

20. The method of claim 19, wherein the capping agent is poly(vinyl pyrrolidone) having a molecular weight of 50,000.

* * * * *